United States Patent [19]

Cuddy

[11] Patent Number: 4,952,893
[45] Date of Patent: Aug. 28, 1990

[54] ATTENUATING CIRCUIT

[75] Inventor: Bernard M. Cuddy, Cambridge, Mass.

[73] Assignee: Teradyne, Inc., Boston, Mass.

[21] Appl. No.: 322,661

[22] Filed: Mar. 13, 1989

[51] Int. Cl.$^5$ .............................................. H03H 7/24
[52] U.S. Cl. .................................. 333/81 R; 324/723
[58] Field of Search ............... 333/81 R, 81A; 324/63

[56] References Cited

U.S. PATENT DOCUMENTS 4,138,637  2/1979  Weinert ..................... 333/81 R X
4,330,765  5/1982  Patukonis ..................... 333/81 A

OTHER PUBLICATIONS

Weinert et al, *A1-18-GHz Attenuator Calibrator*, IEEE Transion Instrumentation & Measurement, Dec. 1976, pp. 298–306.
R. F. and Microwave Equipment and Components, Weinschel Engineering, Gaithersburg, Md., 1985, Front Cover & pp. 155 & 325 relied on.

Primary Examiner—Paul Gensler

[57] ABSTRACT

An attenuating circuit including a reference signal path that is attenuated by an amount which is related to the attenuation in an attenuation signal path for the purpose of improving attenuation accuracy.

15 Claims, 1 Drawing Sheet

ATTENUATING CIRCUIT

BACKGROUND OF THE INVENTION

The present invention relates to attenuating circuits.

It is known to provide attenuating circuits using relays, PIN diodes, or Gallium Arsenide switches to alternate between an attenuation signal path, which attenuates a signal, and a reference signal path, which passes the signal without attenuation. The reference signal path is used to initially calibrate, using a leveling circuit, the attenuating circuit to compensate for signal denigration such as signal rolloff due to transmission of the signal.

SUMMARY OF THE INVENTION

It has been discovered that by providing a reference signal path that is attenuated by an amount which is related to the attenuation in an attenuation signal path, an attenuating circuit which has superior offset characteristics and a wide frequency range is advantageously produced.

In preferred embodiments: the attenuation path amount includes an attenuator value and a calibration value, and the reference path amount is substantially equal to the calibration value; the attenuating circuit further includes an input, an output, and first and second switches configured to alternately connect the attenuation signal path and the reference signal path between the input and the output; the first and second switches are single-pole, double-throw switches; the first and second switches have a significant series resistance; the first and second switches are Gallium Arsenide (GaAs) switches; the attenuation signal path and the reference signal path have substantially equal characteristic impedances, the calibration value is small; and, the calibration value is less than 1dB.

In another aspect, the invention includes a step attenuator circuit including a plurality of attenuating circuits, each attenuating circuit having a value and including an attenuation signal path being configured to attenuate a signal by an amount related to the attenuating circuit value and a reference signal path being configured to attenuate the signal by a second amount, the second amount being related to the respective attenuating circuit value.

In preferred embodiments of this aspect of the invention, the attenuating circuit values include attenuation values and calibration values, and the second amounts are substantially equal to respective calibration values; the attenuation values are substantially equal to binary numbers; there are six attenuating circuits, and the attenuating circuits have attenuating circuit values of $-1$, $-2$, $-4$, $-8$, and $-16$ and $-16$ dB, respectively; the calibration value is small; and, the calibration value is less than 1dB.

In another aspect, the invention is a signal generation system including a signal generator being configured to output a signal, an attenuating circuit configured to receive the signal and output an attenuated signal, the attenuating circuit including an attenuation signal path being configured to attenuate the signal by a first amount and a reference signal path being configured to attenuate the signal by a second amount, the second amount being related to the first amount, a leveling circuit, the leveling circuit being configured to provide a base signal using the signal attenuated by the second amount and receive the signal attenuated by the first amount and to output a calibrated test signal.

DESCRIPTION OF THE PREFERRED EMBODIMENT

The drawings will first be briefly described.

Structure

Figure 1:
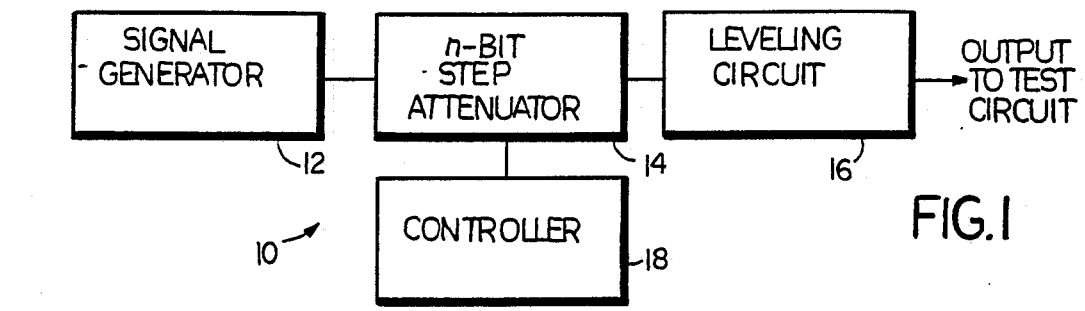
FIG. 1 shows a system utilizing a digital attenuator according to the invention.

Referring to FIG. 1, signal generating system 10 includes signal generator 12 (e.g., a RF/microwave signal generator) outputting a signal to n-bit step attenuator circuit 14. Attenuator circuit 14 outputs an attenuated signal to leveling circuit 16. The output of leveling circuit 16 provides the input to a test circuit, e.g., a device under test (DUT). Attenuator circuit 14 is controlled by controller 18.

Figure 2:
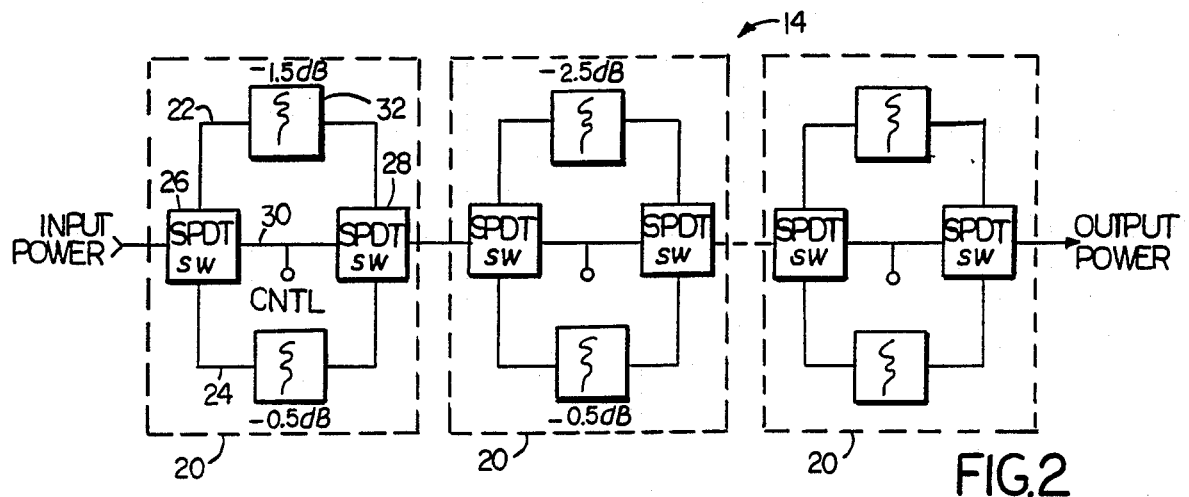
FIG. 2 shows an attenuator circuit of the FIG. 1 system.

Referring to FIG. 2, n-bit step attenuator circuit 14 includes n single bit attenuator circuits 20. (E.g., a 3-bit step attenuator includes 3 single bit attenuator circuits.) Attenuator circuits 20 are arranged to provide attenuation values which correspond to binary numbers thereby allowing a range of attenuator values to be available to controller 18. (E.g., a 6-bit step attenuator could have attenuator circuit values of $-1$, $-2$, $-4$, $-8$ $-16$ and $-16$ dB to provide an attenuation range from $-1$ dB to $-47$ dB.)

Each single bit attenuator circuit 20 includes an attenuation path 22 and a reference path 24. At any given time, one of these paths is chosen by switches 26, 28, which may be, e.g., single-pole, double-throw Gallium Arsenide (GaAs) switches. GaAs switches allow extremely fast switching over a broad frequency range, e.g., GaAs switches are commercially available having usable frequency ranges from D.C. to approximately 20 GHz. Switches 26, 28 are controlled by controller 18 which is connected to individual switches 26, 28 via respective control lines 30.

Attenuation path 22 includes attenuation path attenuator 32 having an attenuator value equal to the binary value of attenuation circuit 20 plus a calibration value. The calibration value is preferably small, e.g., less than 1 dB. Reference path 24 includes reference path attenuator 34 having an attenuator value substantially equal to the calibration value of attenuation path attenuator 32. Attenuators 32, 34 also have characteristic impedances that are substantially equal.

operation

Referring to FIGS. 1 and 2, prior to using attenuator circuit 14 to attenuate signals, system 10 is leveled by leveling circuit 16 such that a base signal having a nominal reference power, $P_n$, is constant over frequency. This leveling takes into account such things as rolloff due to transmission of the signal through the cables. This leveling also compensates for attenuators that are present in the reference signal path. GaAs switches have an impedance of about 5-10 $\Omega$, have a significant series impedance.

More specifically, switches 26, 28 of attenuator circuits 20 are controlled to pass the signal outputted from signal generator 12 through the reference paths. Due to reference path attenuator 34, the voltage divider loss due to the series resistances of the switches is incorporated into the reference path calibrated by leveling circuit 16. Because the value of attenuator 34 equals the calibration value of attenuator 32 the offset of the outputted signal is equalized for both paths through attenuator circuit 20. Because this voltage divider loss is calibrated during the leveling of system 10, this loss does not cause an offset when attenuation path 22 is used.

After system 10 is calibrated, attenuation circuits 20 may be switched to attenuation paths 22 by controller 18 according to the amount the inputted signal is to be attenuated. Thus, the signal inputted to the test circuitry is attenuated without a corresponding offset.

Figure 3:
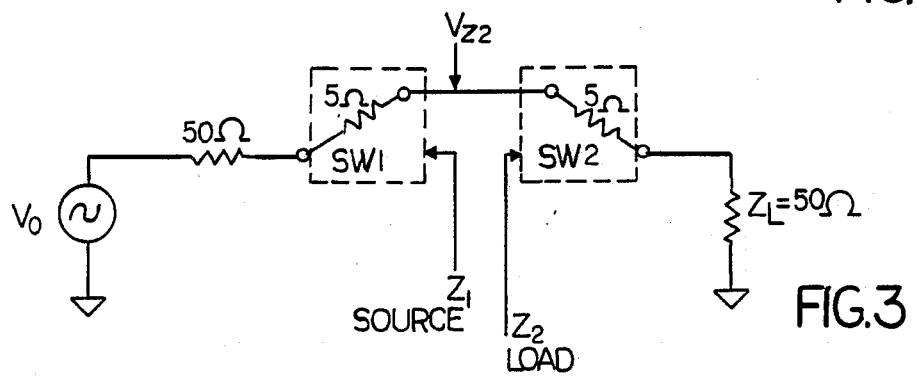
FIG. 3 shows a schematic diagram of an unattenuated signal path.
Figure 4:
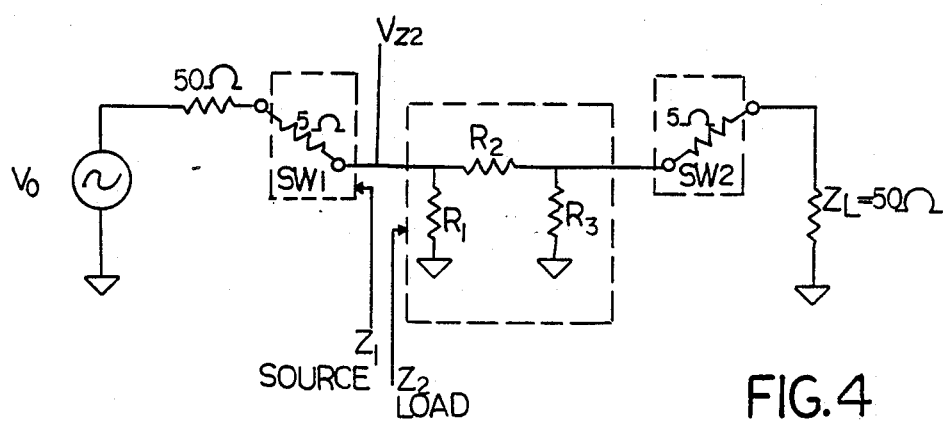
FIG. 4 shows a schematic diagram of an attenuated signal path.

Referring to FIGS. 3 and 4, the offset error between a reference signal path having no attenuation (i.e., an example that does not describe the invention herein as there is attenuation in both the attenuation path and the reference signal path in the invention) and an attenuation signal path is shown. In FIGS. 3 and 4 it is assumed that switches SW1 and SW2 have a 5Ω series resistance.

Referring to FIG. 3, in the reference signal path, for a matched circuit (i.e., the load resistance equals the source resistance), $V_{ZZ}$, the voltage after switch SW1 is defined by the following formula:

$$V_{Z2} = \frac{Z_2 V_o}{Z_1 + Z_2}, \quad (1)$$

where,
$Z_1 = 55\Omega$,
$Z_2 = 55\Omega$, and
$V_o$ = Voltage of Source.
Thus, $V_{ZZ} = 0.5 V_o$.

In FIG. 4, when the signal path includes an attenuator, the output of SW1, $V_{22}$, drops before it gets attenuated. Thus, table 1 shows the additional attenuation, which equals the offset error, for different attenuation values compared to $V_{Z2}$, the voltage after switch SW1 for a matched circuit.

TABLE 1

| Attenuation | VZ2' | Additional Attenuation |
|---|---|---|
| 1 dB | .498 Vo | −0.10 dB |
| 2 dB | .497 Vo | −0.17 dB |
| 4 dB | .486 Vo | −0.27 dB |
| 8 dB | .480 Vo | −0.38 dB |
| 16 dB | .479 Vo | −0.39 dB |

When attenuation is provided on the reference signal path, as it is in the present invention, the circuit is calibrated to compensate for the additional attenuation.

Other Embodiments

Other embodiments are within the following claims.

E.g., switches 26, 28 may be constructed within a single switch such as a transfer switch, thereby providing shorter signal paths for each single bit attenuation circuit 20.

Also, e.g., switches 26, 28 may be constructed of a plurality of single-pole single-throw switches.

Also, e.g., the values of reference path attenuators 34 are not necessarily equal as long as these values are equal to the offset value of their respective attenuation path.

What is claimed is:

1. An attenuating circuit for providing a desired relative attenuation comprising;
   an attenuation signal path,
   said attenuation signal path being configured to attenuate a signal by a first amount, and
   a reference signal path,
   said reference signal path being configured to attenuate said signal by a second amount, said desired relative attenuation being equal to said first amount minus said second amount,
   said attenuation signal path and said reference signal path each having a resistance path to ground,
   said attenuating circuit having an input, an output and first and second switches configured to alternately connect said attenuation signal path and said reference signal path between said input and said output, said first and second switches having a significant series impedance.

2. The attenuating circuit of claim 1 wherein said first and second switches are single-pole, double-throw switches.

3. The attenuating circuit of claim 1 wherein said first and second switches are included in a transfer switch.

4. The attenuating circuit of claim 1 wherein said first and second switches are Gallium Arsenide (GaAs) switches.

5. The attenuating circuit of claim 1 wherein said attenuation signal path and said reference signal path have substantially equal characteristic impedance.

6. The attenuating circuit of claim 1 wherein said second amount is less than 1dB.

7. A step attenuator circuit comprising,
   a plurality of attenuating circuits, each said attenuating circuit having a desired relative attenuation value and including,
      an attenuation signal path configured to attenuate a signal by a first amount related to said desired relative attenuation value, and
      a reference signal path configured to attenuate said signal by a second amount, said desired relative attenuation being equal to said first amount minus said second amount,
   said attenuation signal path and said reference signal path each having a resistance path to ground,
   each said attenuating circuit having an input, an output and first and second switches configured to alternately connect said attenuation signal path and said reference signal path between said input and said output, said first and second switches having a significant series impedance.

8. The step attenuator circuit of claim 7 wherein said attenuation values are substantially equal to binary numbers.

9. The step attenuator circuit of claim 8 wherein, there are six attenuating circuits, and
   said attenuating circuits have attenuating circuit values of −1, −2, −4, −8, −16 and −16 dB, respectively.

10. The step attenuator circuit of claim 7 wherein said second amount is less than 1 dB.

11. The step attenuator circuit of claim 7 wherein said first and second switches are Gallium Arsenide (GaAs) switches.

12. A signal generation system comprising,
   a signal generator, said signal generator being configured to output a source signal,
   an attenuating circuit configured to receive said source signal and output an attenuated signal has a desired relative attenuation with respect to said source signal, said attenuating circuit including, an attenuation signal path configured to attenuate said signal by a first amount, and a reference signal path configured to attenuate said signal by a second amount, said desired relative attenuation being equal to said first amount minus said second amount, said attenuation signal path and said reference signal path each having a resistance path to ground, said attenuating circuit having an input, an output and first and second switches configured to alternately connect said attenuation signal path and said reference signal path between said input and said output, said first and second switches having a significant series impedance, and a leveling circuit, said leveling circuit being configured to provide a base signal using said signal attenuated by said second amount and to receive said signal attenuated by said first amount and to output a calibrated test signal.

13. The signal generation system of claim 12 wherein said first and second switches are Gallium Arsenide (GaAs) switches.

14. A method of calibrating an attenuating circuit that provides a desired relative attenuation comprising, providing a reference signal to a first switch, a reference signal path that has a resistance path to ground, and a second switch, said first and second switches having a significant series impedance, attenuating said reference signal by a first amount in said reference signal path, leveling said reference signal to a base signal, providing a test signal to said first switch, an attenuation signal path that has a resistance path to ground, and said second switch, attenuating said test signal by a second amount in said attenuation signal path, said desired relative attenuation being equal to said second amount minus said first amount, and leveling said test signal, said leveling said test signal being related to said leveling said reference signal.

15. The method of claim 14 wherein said first and second switches are Gallium Arsenide (GaAs) switches.

* * * * *

UNITED STATES PATENT AND TRADEMARK OFFICE
CERTIFICATE OF CORRECTION

PATENT NO. : 4,952,893

DATED : August 28, 1990

INVENTOR(S) : Bernard M. Cuddy

It is certified that error appears in the above-identified patent and that said Letters Patent is hereby corrected as shown below:

Column 2, line 56, "operation" should be --Operation--;

Column 3, line 25, "$V_{zz}$" should be --$V_{z2}$--;

Column 3, line 33, "Z1" should be --$Z_1$--;

Column 3, line 36, "$V_{zz}$" should be --$V_{z2}$--;

Column 3, line 38, "$V_{22}$" should be --$V_{z2}'$--;

Column 4, line 2, ";" should be --,--;

and

Column 6, line 12, "provid-" should begin a new paragraph.

Signed and Sealed this

Third Day of March, 1992

Attest:

HARRY F. MANBECK, JR.

*Attesting Officer*      *Commissioner of Patents and Trademarks*